(12) United States Patent
Pannocchia et al.

(10) Patent No.: US 11,866,845 B2
(45) Date of Patent: Jan. 9, 2024

(54) METHODS FOR GROWING SINGLE CRYSTAL SILICON INGOTS THAT INVOLVE SILICON FEED TUBE INERT GAS CONTROL

(71) Applicant: GlobalWafers Co., Ltd., Hsinchu (TW)

(72) Inventors: Matteo Pannocchia, Lana (IT); Maria Porrini, Merano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 23 days.

(21) Appl. No.: 17/570,141

(22) Filed: Jan. 6, 2022

(65) Prior Publication Data

US 2023/0212778 A1 Jul. 6, 2023

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01)

(58) Field of Classification Search
CPC ....... C30B 15/10; C30B 29/06; C30B 15/002; C30B 15/02; Y10T 117/1056
See application file for complete search history.

(56) References Cited

U.S. PATENT DOCUMENTS

| | | | |
|---|---|---|---|
| 5,152,433 A | 10/1992 | Mohri | |
| 5,244,646 A | 9/1993 | Stanley | |
| 5,876,496 A * | 3/1999 | Nagai | C30B 15/02 |
| | | | 117/214 |
| 9,435,053 B2 | 9/2016 | Kwon et al. | |
| 10,060,045 B2 | 8/2018 | Scala et al. | |
| 2005/0279277 A1 | 12/2005 | Holder et al. | |
| 2006/0174817 A1 | 8/2006 | Krautbauer et al. | |
| 2007/0119365 A1 | 5/2007 | Kazuhiro et al. | |
| 2011/0132257 A1 * | 6/2011 | Narushima | C30B 15/04 |
| | | | 117/218 |
| 2015/0259821 A1 * | 9/2015 | Kwon | C30B 15/12 |
| | | | 117/214 |
| 2015/0259822 A1 * | 9/2015 | Kwon | C30B 15/002 |
| | | | 117/214 |
| 2016/0017513 A1 * | 1/2016 | Haringer | C30B 15/04 |
| | | | 117/19 |
| 2019/0136406 A1 | 5/2019 | Haringer et al. | |

(Continued)

FOREIGN PATENT DOCUMENTS

| | | |
|---|---|---|
| CN | 207091548 U | 3/2018 |
| DE | 102013204484 A1 | 9/2014 |
| JP | 2525294 B2 | 12/1992 |

(Continued)

OTHER PUBLICATIONS

W. Dewald et al., Phase Diagram of Si Nanowire Growth by Disproportionation of SiO, Elsevier, Journal of Crystal Growth 312 (2010) 1751-1754, 4 pages.

(Continued)

*Primary Examiner* — Robert M Kunemund
(74) *Attorney, Agent, or Firm* — Armstrong Teasdale LLP

(57) ABSTRACT

Methods for growing single crystal silicon ingots that involve silicon feed tube inert gas control are disclosed. Ingot puller apparatus that include a flange that extends radially from a silicon funnel or from a silicon feed tube to reduce backflow of gases from the silicon feed tube into the growth chamber are also disclosed.

14 Claims, 11 Drawing Sheets

(56) References Cited

U.S. PATENT DOCUMENTS

2020/0190690 A1* 6/2020 Scala ............... C30B 29/06

FOREIGN PATENT DOCUMENTS

| JP | H0711177 | * | 3/1995 |
| JP | 20050145729 A | | 6/2005 |
| JP | 2008266094 A | | 11/2008 |
| JP | 2020083735 H | | 6/2020 |
| KR | 100894295 B1 | | 4/2009 |

OTHER PUBLICATIONS

Y.F. Zhang et al., Bulk-Quantity Si Nanowires Synethsized by SiO Sublimation, Elsevier, Journal of Crystal Growth 212 (2000) 115-118, 4 pages.

* cited by examiner

METHODS FOR GROWING SINGLE CRYSTAL SILICON INGOTS THAT INVOLVE SILICON FEED TUBE INERT GAS CONTROL

FIELD OF THE DISCLOSURE

The field of the disclosure relates to methods for growing single crystal silicon ingots that involve silicon feed tube inert gas control and to ingot puller apparatus that include a flange that extends radially from a silicon funnel or from a silicon feed tube to reduce backflow of gases from the silicon feed tube into the growth chamber.

BACKGROUND

Continuous Czochralski (CCz) is well suited to form 300 mm or 200 mm diameter single crystal silicon ingots. Continuous Czochralski methods involve forming a single crystal silicon ingot from a melt of silicon while continuously or intermittently adding solid polycrystalline silicon to the melt to replenish the melt while the ingot is grown. The methods may involve forming multiple ingots from the same melt while the hot zone remains at temperature (i.e., with a melt continuously being present in the crucible assembly while the plurality of ingots is grown).

Solid-state silicon is added to the melt through a silicon feed tube that directs the silicon to the melt. Periodically, the silicon feed tube becomes occluded and silicon cannot pass through the tube. Clogging of the feed tube causes the ingot production run to be stopped and the ingot puller apparatus to be taken out of service which reduces throughput and increases cost. An inert gas such as argon may be passed through the tube to reduce clogging. However, the flow of inert gas can cause inert gas bubbles (e.g., argon bubbles) to form in the melt which impacts the void count in the resulting ingot and sliced wafers. Customers expect that wafers grown by continuous Czochralski have the same relatively low void count as wafers grown by standard batch Czochralski.

A need exists for ingot puller apparatus and methods for forming an ingot that reduce occlusion of the silicon feed tube and that do not result in formation of excessive inert gas bubbles in the melt.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for growing a single crystal silicon ingot in a continuous Czochralski process in an ingot puller apparatus. The ingot puller apparatus includes a housing defining a growth chamber, a crucible assembly disposed in the growth chamber, and a silicon feed tube for adding solid silicon to the crucible assembly. A melt of silicon is formed in a crucible assembly. Heat is applied to the melt in a stabilization phase. An inert gas is introduced into the silicon feed tube at a first inert gas feed rate during the stabilization phase. A surface of the melt is contacted with a seed crystal. A single crystal silicon ingot is withdrawn from the melt in an ingot growth phase. The inert gas is introduced into the silicon feed tube at a second inert gas feed rate during the ingot growth phase. The first inert gas feed rate is greater than the second inert gas feed rate.

Another aspect of the present disclosure is directed to a method for growing a single crystal silicon ingot in a continuous Czochralski process in an ingot puller apparatus. The ingot puller apparatus includes a housing defining a growth chamber, a crucible assembly disposed in the growth chamber, and a silicon feed tube for adding solid silicon to the crucible assembly. A melt of silicon is formed in a crucible assembly. Heat is applied to the melt in a stabilization phase. An inert gas is introduced into the silicon feed tube at a first inert gas feed rate during the stabilization phase. The first inert gas feed rate is between 2.5 and 3.5 slpm. A surface of the melt is contacted with a seed crystal. A single crystal silicon ingot is withdrawn from the melt in an ingot growth phase. The inert gas is introduced into the silicon feed tube at a second inert gas feed rate during the ingot growth phase. The second inert gas feed rate is between 2.5 and 3.5 slpm.

A further aspect of the present disclosure is directed to an ingot puller apparatus for manufacturing a single crystal silicon ingot. The ingot puller apparatus includes a crucible assembly for holding a silicon melt. A crystal puller housing defines a growth chamber for pulling a silicon ingot from the melt. The crucible assembly is disposed within the growth chamber. The ingot puller apparatus includes a silicon feed tube for adding solid silicon to the crucible assembly. A funnel at least partially extends into the silicon feed tube. The funnel and silicon feed tube are separated by a gap. A flange extends radially from the funnel or from the silicon feed tube. The flange extends across at least a portion of the gap to reduce backflow of gases from the silicon feed tube into the growth chamber.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for growing a single crystal silicon ingot in a continuous Czochralski process in an ingot puller apparatus and to ingot puller apparatus having a flange that extends across a portion of a gap between the funnel and silicon feed tube. The methods and apparatus may reduce downstream clogging of the silicon feed tube.

Figure 1:
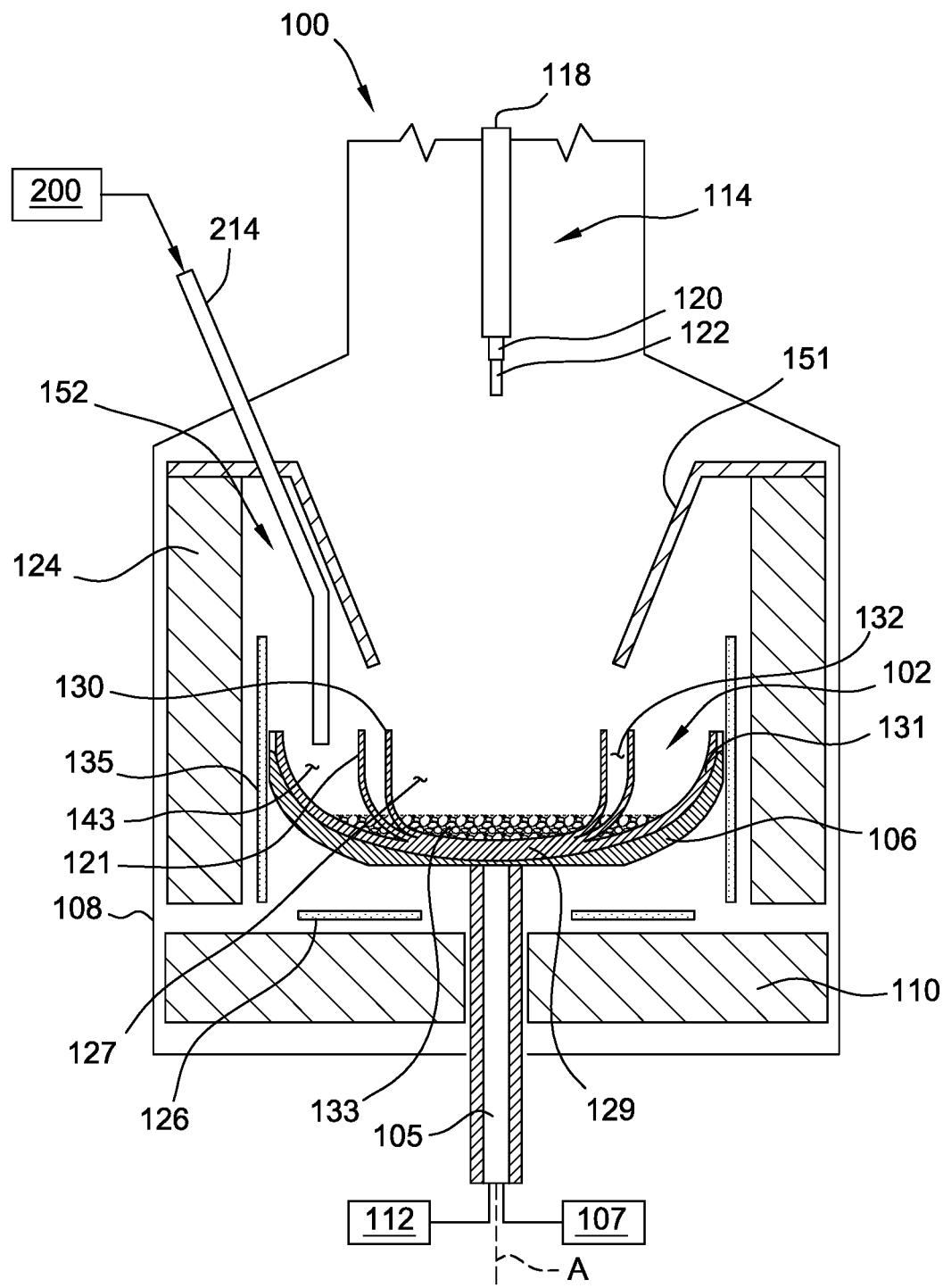
FIG. 1 is a cross-section of an example ingot puller apparatus with a silicon charge disposed in the crucible assembly.
Figure 2:
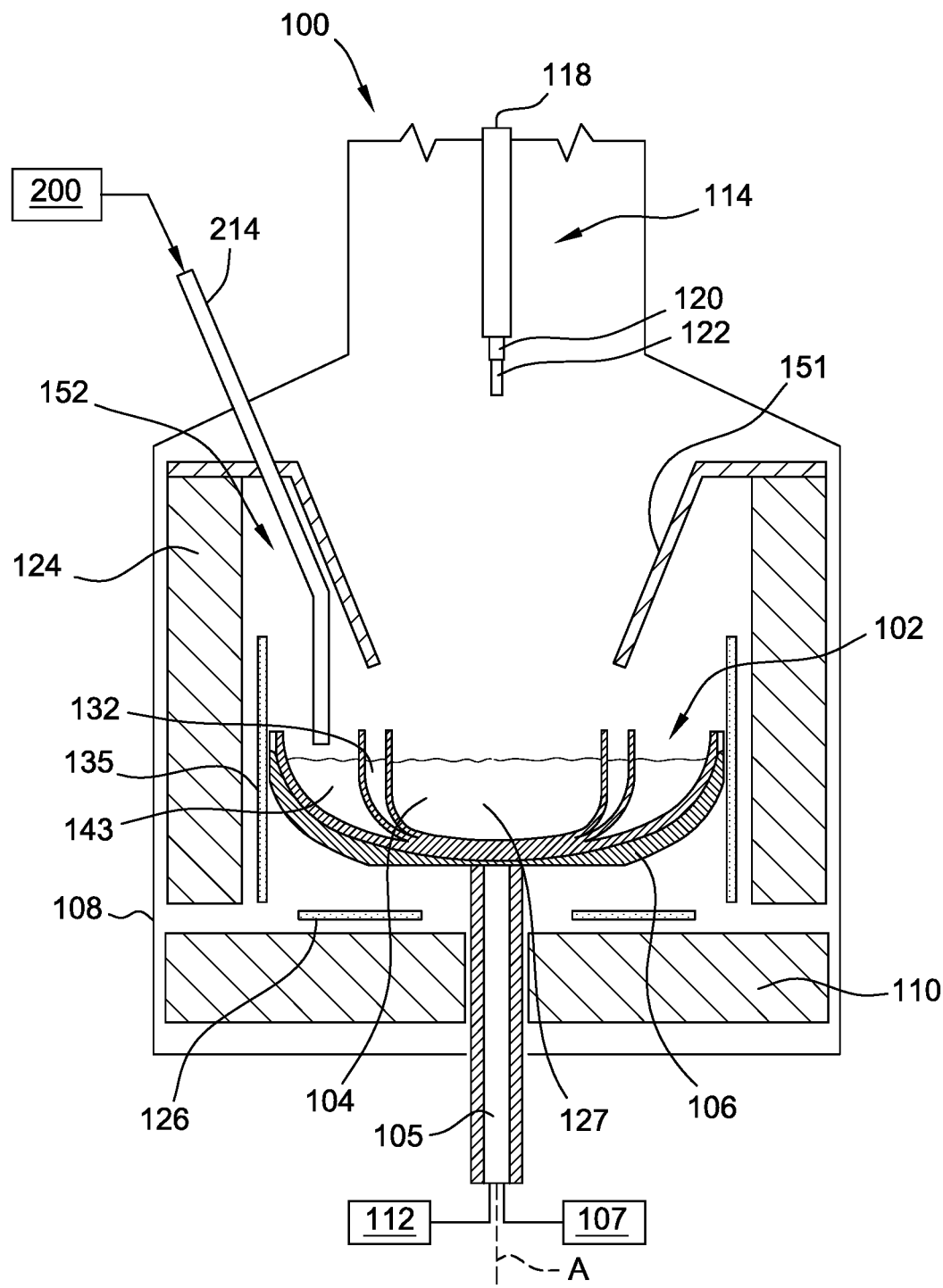
FIG. 2 is a is a cross-section of the ingot puller apparatus after melt-down and during the stabilization phase.

An example ingot puller apparatus (or more simply "ingot puller") is indicated generally at "100" in FIG. 1. The ingot puller apparatus 100 includes a crucible assembly 102 for holding a melt 104 (FIG. 2) of semiconductor or solar-grade material silicon. The crucible assembly 102 is supported by a susceptor 106. The ingot puller apparatus 100 includes a crystal puller housing 108 that defines a growth chamber 152 for pulling a silicon ingot 113 (FIG. 4) from the melt 104 along a pull axis A.

The crucible assembly 102 has a sidewall 131 (FIG. 1) and one or more fluid barriers 121, 130 or "weirs" that separate the melt into different melt zones. In the illustrated embodiment, the crucible assembly 102 includes a first weir 121. The first weir 121 and sidewall 131 define an outer melt zone 143 (FIG. 2) of the silicon melt 104 and the crucible assembly 102. The crucible assembly 102 includes a second weir 130 radially inward to the first weir 121 which defines an inner melt zone 127 of the silicon melt 104 and crucible assembly 102. The inner melt zone 127 is the growth region from which the single crystal silicon ingot 113 (FIG. 4) is grown. The first weir 121 and the second weir 130 define a middle melt zone 132 of the crucible assembly 102 and silicon melt 104 in which the melt 104 may stabilize as it moves toward the inner melt zone 127. The first and second weirs 121, 130 each have at least one opening formed therein to permit molten silicon to flow radially inward towards the inner melt zone 127.

In the illustrated embodiment, the first weir 121, second weir 130, and sidewall 131 each have a generally annular shape. The first weir 121, second weir 130, and sidewall 131 may be part of three nested crucibles which are joined at the bottom or floor 129 of the crucible assembly 102 (i.e., the first and second weirs 121, 130 are the sidewalls of two crucibles nested within a larger crucible). The crucible assembly configuration depicted in FIGS. 1-4 is exemplary. In other embodiments, the crucible assembly 102 has a single layer floor (i.e., does not have nested crucibles) with the weirs extending upward from the floor 129. Optionally, the floor 129 may be flat rather than curved and/or the weirs 121, 130 and/or sidewall 131 may be straight-sided. Further, while the illustrated crucible assembly 102 is shown with two weirs, in other embodiments the crucible assembly may have a single weir or even no weirs.

The susceptor 106 is supported by a shaft 105. The susceptor 106, crucible assembly 102, shaft 105, and ingot 113 (FIG. 4) have a common longitudinal axis or "pull axis" A.

Figure 3:
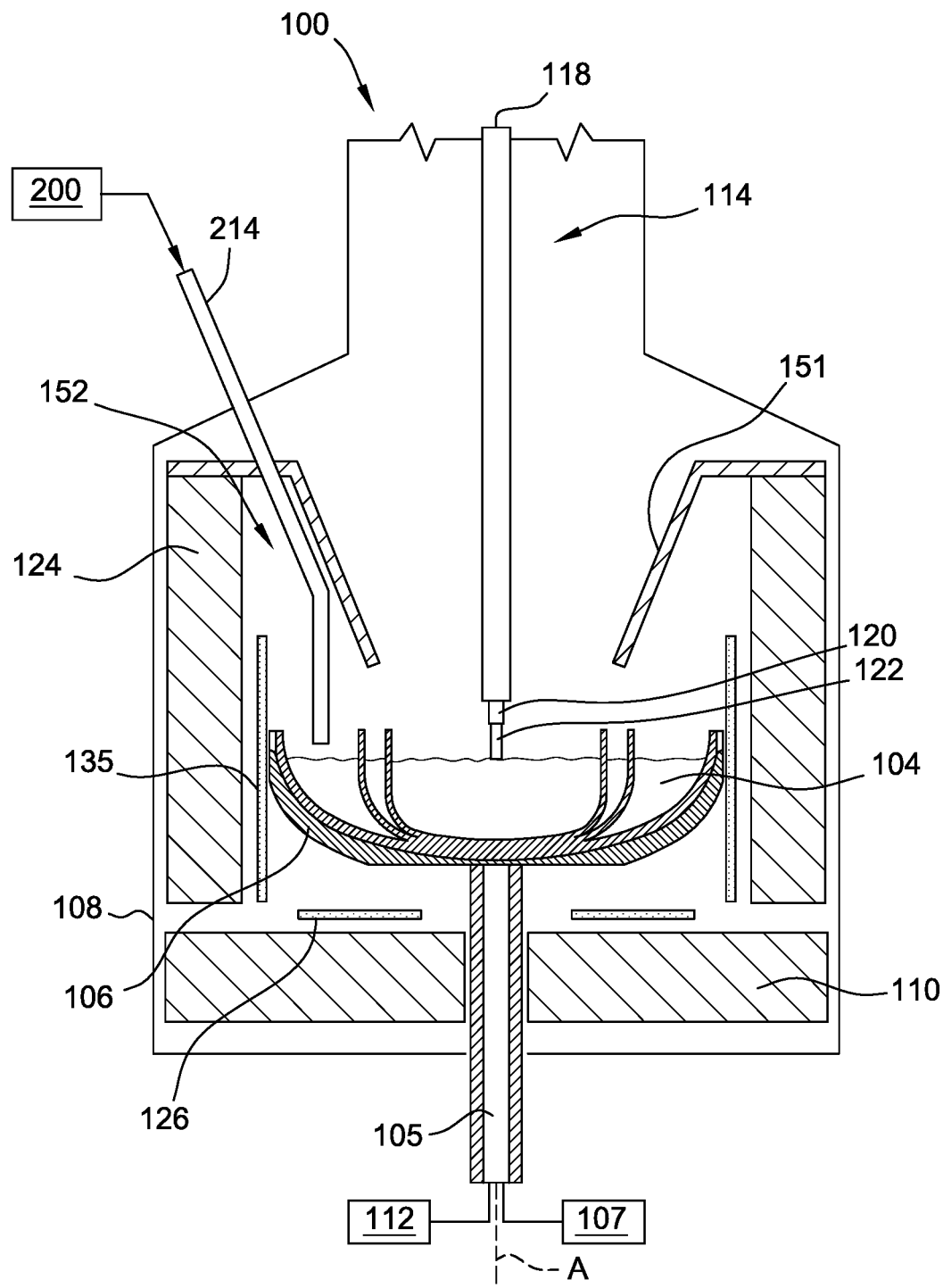
FIG. 3 is a cross-section of the ingot puller apparatus with the silicon seed crystal lowered to contact the melt to begin the ingot growth phase.

A pulling mechanism 114 is provided within the ingot puller apparatus 100 for growing and pulling an ingot 113 (FIG. 4) from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the surface of the melt 104 (FIG. 3). The pulling mechanism 114 is operated to cause the seed crystal 122 to rise. This causes a single crystal ingot 113 (FIG. 4) to be pulled from the melt 104.

During heating and crystal pulling, a crucible drive unit 107 (e.g., a motor) rotates the crucible assembly 102 and susceptor 106. A lift mechanism 112 raises and lowers the crucible assembly 102 along the pull axis A during the growth process. For example, the crucible assembly 102 may be at a lowest position (near the bottom heater 126) in which a charge of solid-phase polycrystalline silicon 133 previously added to the crucible assembly 102 is melted. Crystal growth commences by contacting the melt 104 (FIG. 2) with the seed crystal 122 and lifting the seed crystal 122 by the pulling mechanism 114.

A crystal drive unit (not shown) may also rotate the pulling cable 118 and ingot 113 (FIG. 4) in a direction opposite the direction in which the crucible drive unit 107 rotates the crucible assembly 102 (e.g., counter-rotation). In embodiments using iso-rotation, the crystal drive unit may rotate the pulling cable 118 in the same direction in which crucible drive unit 107 rotates the crucible assembly 102.

According to the Czochralski single crystal growth process, a quantity of solid-phase silicon 133 (FIG. 1) such as polycrystalline silicon, or polysilicon, is charged to the crucible assembly 102. The semiconductor or solar-grade material that is introduced into the crucible assembly 102 is melted by heat provided from one or more heating elements. The size of the solid-phase silicon charge 133 may correspond to the desired size of the melt when ingot growth commences or, as in other embodiments, a smaller charge is used and additional silicon is added by a silicon feed system 200 to form the initial volume of melt present during initiation of ingot growth.

The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible assembly 102 may be moved to be in relatively close proximity to the bottom heater 126 to melt the polycrystalline charged to the crucible assembly 102.

The silicon melt 104 is stabilized in a stabilization phase previous to the ingot grown phase. In some embodiments, the stabilization phase includes at least the period between formation of the melt (after meltdown) and contact of the surface of the melt with the seed crystal. In some embodiments, the stabilization phase also includes the period at which silicon is melted down in the crucible assembly 102 (i.e., meltdown of the initial charge and any other silicon added to form the initial melt).

Figure 4:
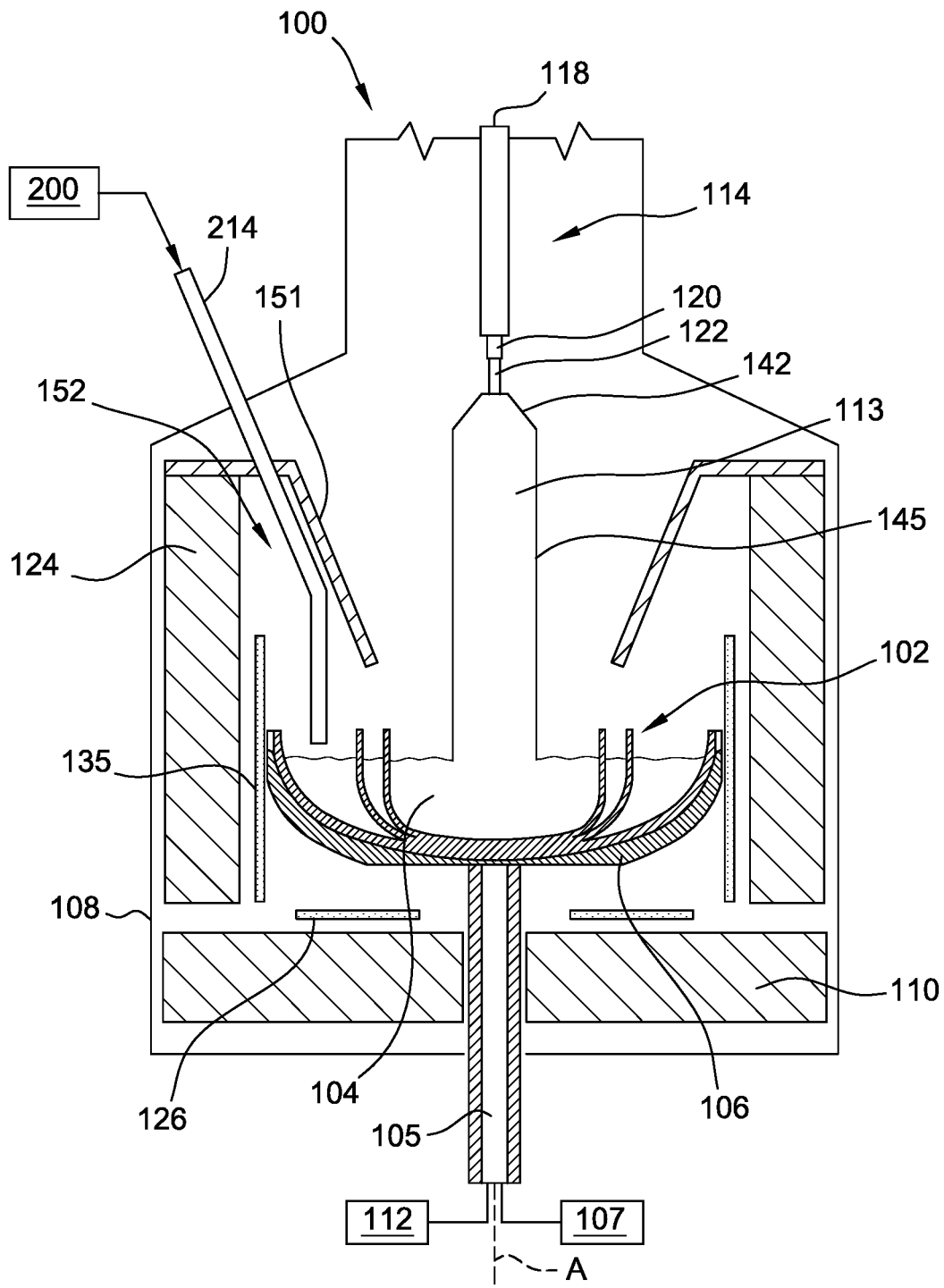
FIG. 4 is a is a cross-section of the ingot puller apparatus during the ingot growth phase.

To form the ingot, after the melt is stabilized in the stabilization phase, the seed crystal 122 is contacted with the surface 111 of the melt 104 as shown in FIG. 3. The pulling mechanism 114 is operated to pull the seed crystal 122 from the melt 104 in an ingot growth phase. Referring now to FIG. 4, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 includes a side heater 135 and a susceptor 106 that encircles the crucible assembly 102 to maintain the temperature of the melt 104 during crystal growth. The side heater 135 is disposed radially outward to the crucible sidewall 131 as the crucible assembly 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible assembly 102 during crystal growth (FIG. 4). The ingot puller apparatus 100 may include an inert gas system to introduce and withdraw an inert gas such as argon from the growth chamber 152.

Figure 5:
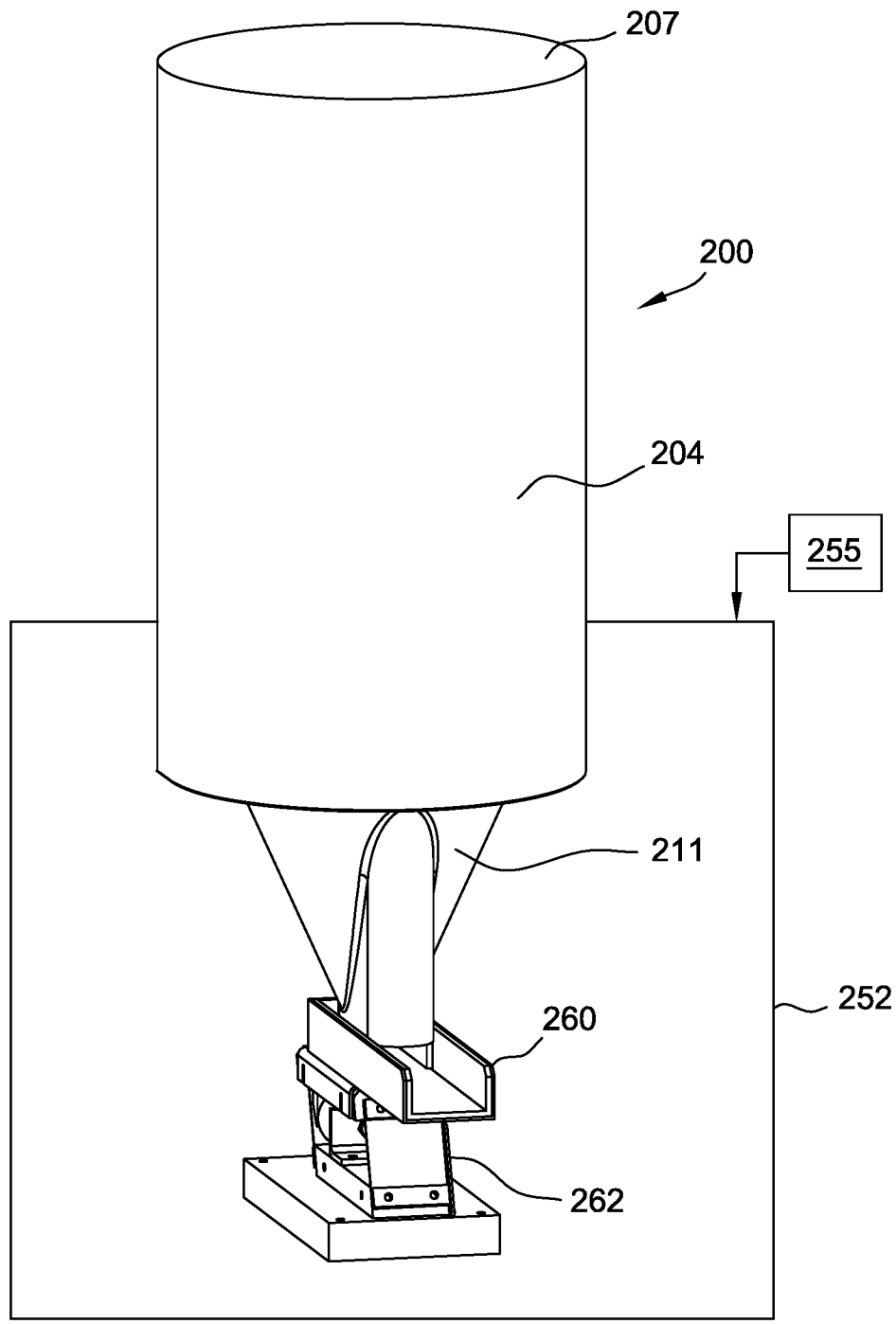
FIG. 5 is a perspective view of a silicon feed system for adding silicon to the crucible assembly.

The ingot puller apparatus 100 also includes a silicon feed system 200 for introducing solid-state silicon (e.g., polycrystalline silicon or single crystal silicon scrap material) into the crucible assembly 102 and, in particular, the outer melt zone 143. The solid-state silicon may be added continuously during ingot growth to maintain a substantially constant melt elevation level and volume during growth of the ingot 113 or may be added intermittently between crystals. The solid silicon that is fed to the crucible assembly 102 by the silicon feed system 200 may be, for example, granular, chunk, chip, or a combination of thereof. The silicon feed system 200 adds or meters solid-state silicon into and through a silicon feed tube 214. Referring now to FIG. 5, an example silicon feed system 200 of the present disclosure is shown. The silicon feed system 200 includes a canister 204 for holding solid-state silicon. The canister 204 includes a removable lid 207 for sealing the canister 204. The canister 204 also includes a funnel portion 211 which directs silicon to a feed tray 260 disposed below the canister 204.

To move silicon from the canister 204 to the feed tube 214, the silicon feed system 200 includes a feed tray 260 disposed below the canister 204 that extends between the canister 204 and a port 229 (FIG. 6) that extends through the ingot puller housing 108. The feed tray 260 is disposed above and is connected to a vibrator 262. Powering the vibrator 262 causes the feed tray 260 to vibrate which conveys silicon from the canister 204 and across the feed tray 260. Silicon is discharged from the feed tray 260 and into a port opening 232 (FIG. 6) (e.g., through a tube or chute (not shown) disposed below the feed tray 260). Silicon falls through the port opening 232 and into a funnel 222 disposed below the port 229. From the funnel 222 the silicon falls into the silicon tube 214. Silicon may be added to maintain a constant position of the melt surface and may be controlled by the power supplied to the vibrator 262.

The port 229 and silicon feed tube 214 are sealed with the canister 204 to isolate the growth chamber 152 (FIG. 1) of the ingot puller apparatus 100 from the surrounding ambient. For example, the silicon feed system 200 may include an outer housing 252 with other components of the feed system being disposed within the outer housing 252. An inert gas such as argon may be introduced from an inert gas feed vessel 255 into the outer housing 252. The inert gas passes through the port opening 232 (FIG. 6) and into the silicon feed tube 214.

The silicon feed system 200 is exemplary and any feed system that enables silicon to be introduced into the crucible assembly 102 may be used. For example, other feed systems may include liquid feed systems.

Figure 6:
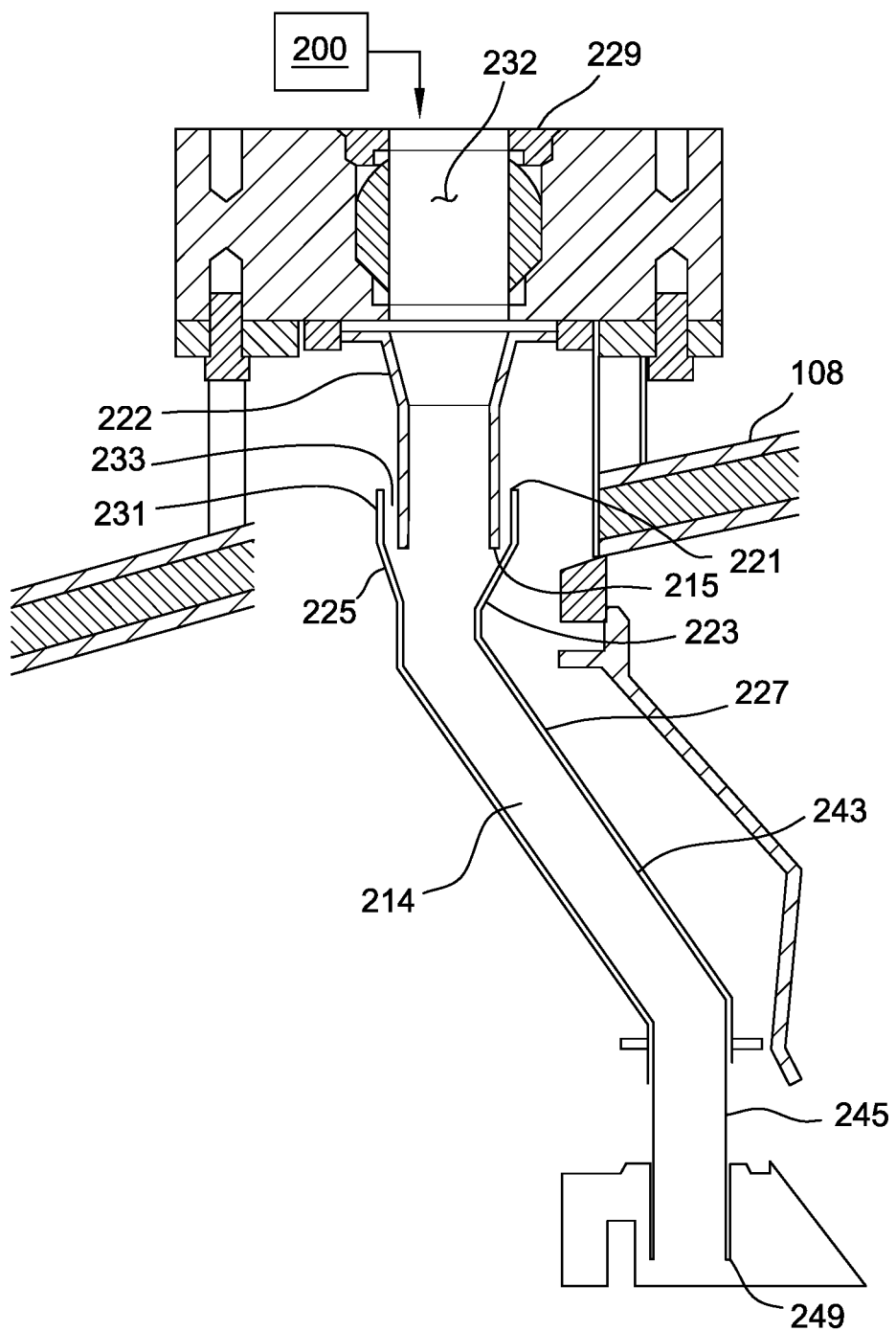
FIG. 6 is a detailed cross-section of the ingot puller apparatus showing the silicon feed tube.

Referring now to FIG. 6, the tube 214 includes a receiving portion 225 and a main portion 227 disposed below the receiving portion 225. The funnel 222 is partially disposed within the receiving portion 225 of the silicon feed tube 214. The receiving portion 225 of the tube includes a constant diameter segment 231 and a tapering segment 223 that tapers to the main portion 227 of the tube 214. The main portion 227 of the tube 214 has an angled segment 243 (i.e., a segment that extends radially inward in the puller apparatus 100) and a terminal segment 245 that extends from the angled segment 243. The silicon tube 214 includes an upper end 221 and a lower end 249.

In accordance with embodiments of the present disclosure, the amount of inert gas that is introduced into the port 229 and that travels through the funnel 222 and the silicon tube 214 is regulated to reduce downstream clogging of the tube 214. For example, different flow rates may be used during the stabilization phase and the ingot growth phase. During the stabilization phase, the inert gas is introduced into the silicon feed tube at a first inert gas feed rate. During the ingot growth phase, the inert gas is introduced into the silicon feed tube at a second inert gas feed rate. The first inert gas feed rate is greater than the second inert gas feed rate. For example, the ratio of the first inert gas feed rate to the second inert gas feed rate may be at least 5:4, at least 4:3, at least 3:2 or at least 2:1. In some embodiments, the first inert gas feed rate is greater than 3 slpm and the second inert gas feed rate is from 1 slpm to 3 slpm. For example and in accordance with some particular embodiments, the first inert gas feed rate and the second inert gas feed rate are each between 2.5 and 3.5 slpm.

It should be noted that the inert gas feed rates and ratios described above may apply to the entire respective stabilization phase or inert gas phase or, as in some embodiments, at least 75% of the respective phase, or at least 85%, at least 95%, or at least 99% of the respective phase.

In some embodiments, there may be a gap 233 (e.g. open gap as shown in FIG. 6) between the funnel 222 and the silicon feed tube 214. Some inert gas may exit the gap 233 instead of proceeding through the length of the tube 214. The flow rates and/or ratios of flow rates described herein may refer to the amount of gas introduced through the port opening 232 (i.e., upstream of any gases passing through gap 223).

Figure 7:
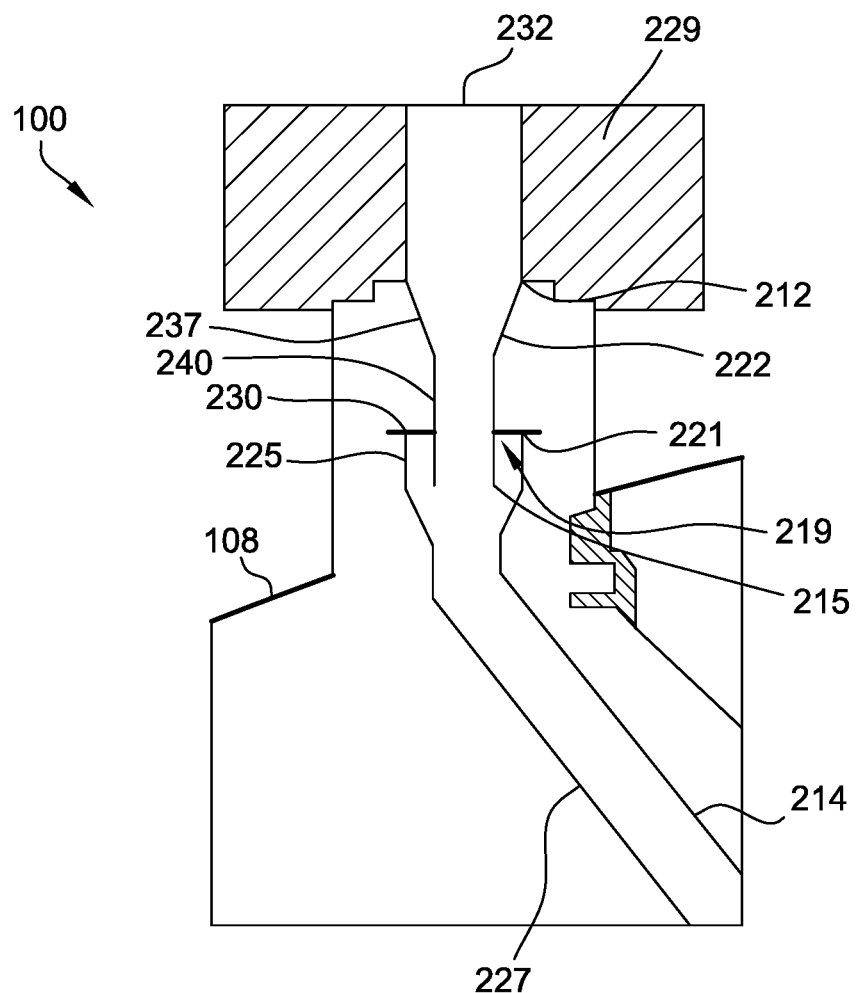
FIG. 7 is a detailed cross-section of an embodiment of an ingot puller apparatus showing a flange that extends from the funnel.
Figure 8:
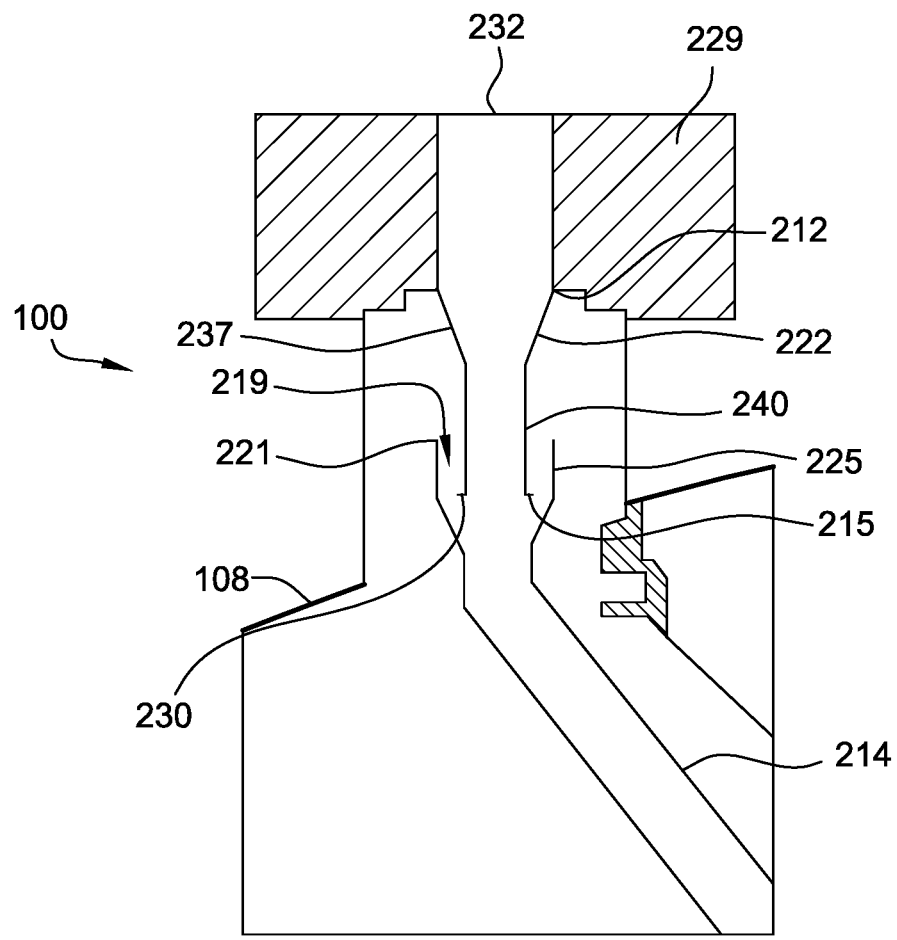
FIG. 8 is a detailed cross-section of another embodiment of an ingot puller apparatus showing a flange that extends from the lower end of the funnel.

Referring now to FIGS. 7-8, in some embodiments, the silicon feed tube 214 and/or funnel 222 may be modified relative to conventional tubes and funnels. The feed tube 214 and/or funnel may reduce clogging of the tube 214 relative to conventional tubes and funnels. The silicon feed tube 214 and/or funnel 222 described below may be used in combination with the inert gas flow rates and ratios described above or the flow rates and ratios may be used without the modified tube 214 and funnel 222 and the modified tube 214 and funnel 222 may be used with different inert gas flow rates and ratios.

As shown in FIG. 7, the funnel 222 at least partially extends into the silicon feed tube 214. The funnel 222 includes a tapering portion 237 that is disposed below the opening 232 of the port 229. The funnel 222 has a chute portion 240 that partially extends into the silicon feed tube 214. The funnel 222 has an upper end 212 and a lower end 215 with the lower end 215 being disposed within the silicon feed tube 214. The silicon feed tube 214 includes a receiving portion 225 in which the chute portion 240 of the funnel 222 is partially disposed. The receiving portion 225 has a diameter larger than the main portion 227 of the tube 214.

The funnel 222 and silicon feed tube 214 are separated by a gap 219. The ingot puller apparatus 100 includes a flange 230 that extends radially from the funnel 222. The flange 230 extends across at least a portion of the gap 219 (e.g., the entire gap 219 as shown in FIG. 7 or partially across the gap 219 as shown in FIG. 8) to reduce backflow of gases from the silicon feed tube 214 into the growth chamber 152 (FIG. 1).

In the embodiment illustrated in FIG. 7, the flange 230 extends from the funnel 222 and is disposed above the silicon feed tube 214 (i.e., directly above). The flange 230 contacts an upper end 221 of the feed tube 214. In the embodiment illustrated in FIG. 8, the flange 230 extends from the funnel 222 and is disposed within the silicon feed tube 214 (e.g., the receiving portion 225 of the tube 214). The flange 230 only partially extends across a portion of the gap 219. In the illustrated embodiment, the flange 230 extends from the lower end 215 of the funnel 222. In some embodiments, the ingot puller apparatus of FIG. 7 is modified to also include the flange shown in FIG. 8 (i.e., the ingot puller apparatus 100 includes both flanges). The flange 230 of FIG. 7 and the flange 230 of FIG. 8 may extend from either the feed tube 214 or funnel 222.

The flange 230 may be made of quartz (e.g., devitrified quartz) or silicon carbide. The flange 230 may be a separate ring that is connected to the tube 214 or funnel 222 or may be integral with the tube 214 or funnel 222 (e.g., as one manufactured part).

It should be noted that in embodiments in which the ingot puller apparatus has been modified from conventional apparatus, generally any ingot puller apparatus that includes a flange that extends across a portion of the gap to reduce backflow of gases from the silicon feed tube into the growth chamber may be used unless stated otherwise. The ingot puller apparatus shown in FIGS. 7-8 are example apparatus and other arrangements of silicon tubes, funnels and/or flanges may be used. While the silicon feed tube 214 has been described with reference to addition of silicon, the tube 214 may be used to add dopant or quartz cullets to the silicon melt.

Compared to conventional methods, the methods of the present disclosure for growing a single crystal silicon ingot in a continuous Czochralski process have several advantages. Without being bound by any particular theory, it is believed that clogging of the feed tube is caused by chemical vapor deposition of silicon oxides ($SiO_x$) on the inner surface of the feed tube. The silicon oxide originates from the silicon melt from which it evaporates and rises inside the feeding tube due to buoyancy forces. Once inside the feed tube, silicon oxide rises and encounters lower temperature regions causing deposition of metallic silicon and silicon dioxide by the formula:

$$2SiO \rightarrow SiO_2 + Si \quad (1).$$

It is believed that by reducing the SiO concentration to 1 wt % or less, clogging in the feed tube may be prevented. During the stabilization phase, it is more difficult to suppress the concentration of SiO due to the higher temperatures used to keep the silicon molten. Clogging of the feed tube causes the ingot production run to be stopped and the ingot puller apparatus to be taken out of service. By controlling the flow rate of inert gas that passes through the silicon feed tube such that the flow rate is higher during the stabilization phase and relatively lower during the ingot growth phase, the flow rate is increased during high temperature stabilization phase (stabilization contributing to more clogging than the ingot growth phase due to its higher temperature) and the flow rate is decreased during ingot growth which reduces inert gas bubbles which cause defects in the ingot.

In embodiments in which the ingot puller apparatus includes a flange that extends radially from the funnel or from the silicon feed tube and extends across at least a portion of a gap between the funnel and the feed tube, the flange reduces backflow of gases from the silicon feed tube into the growth chamber.

In embodiments in which the inert gas feed rate is near 3 slpm (e.g., 2.5 slpm to 3.5 slpm) in both the stabilization phase and ingot growth phase, the concentration of SiO in the silicon feed tube may be maintained at 1.0 wt % at all stages of the ingot growth process which is believed to be the threshold at which the CVD reaction occurs.

EXAMPLES

The processes of the present disclosure are further illustrated by the following Examples. These Examples should not be viewed in a limiting sense.

Figure 9:
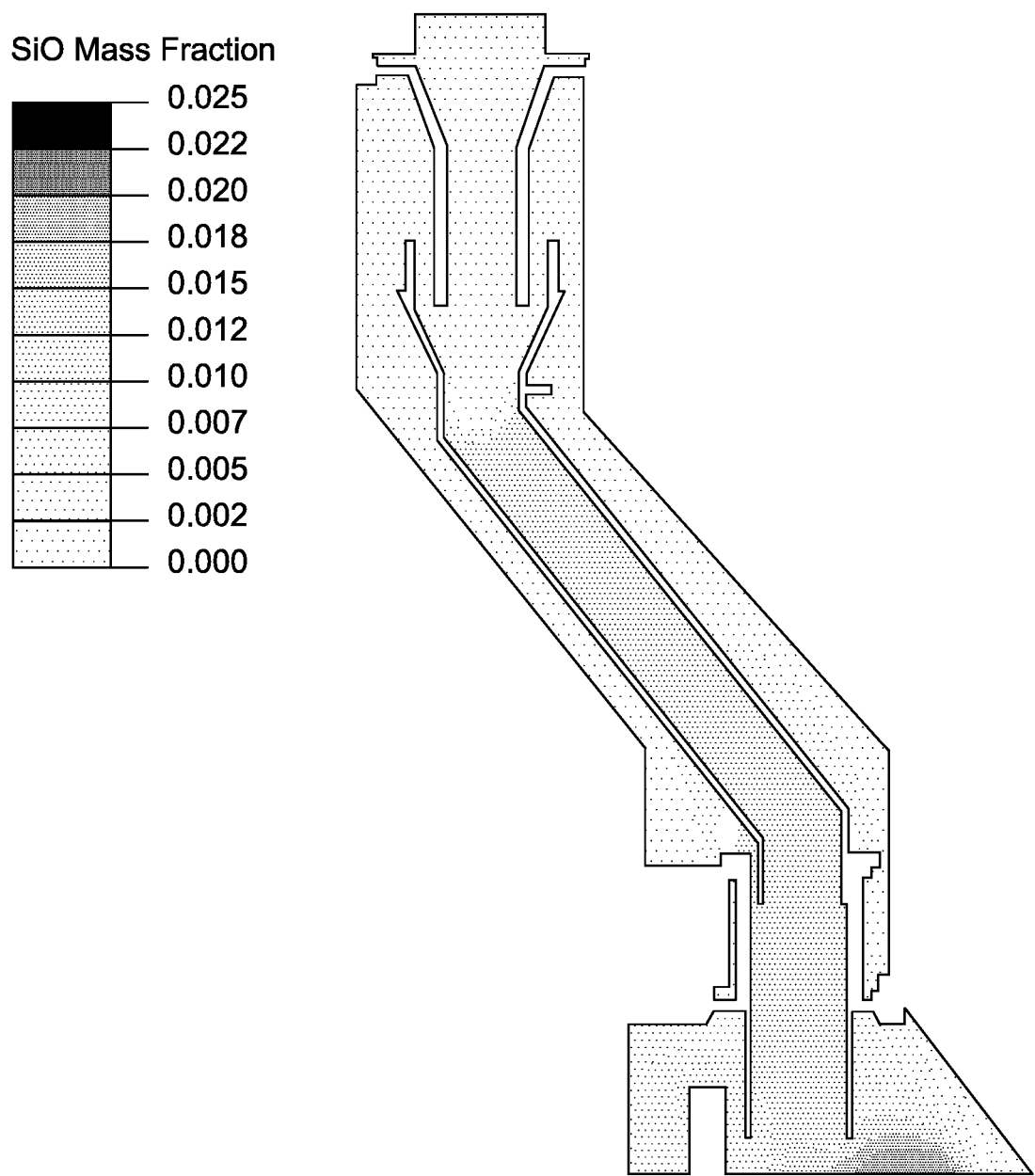
FIG. 9 is a simulation of the mass fraction of SiO in the silicon feed tube during the ingot growth phase.
Figure 10:
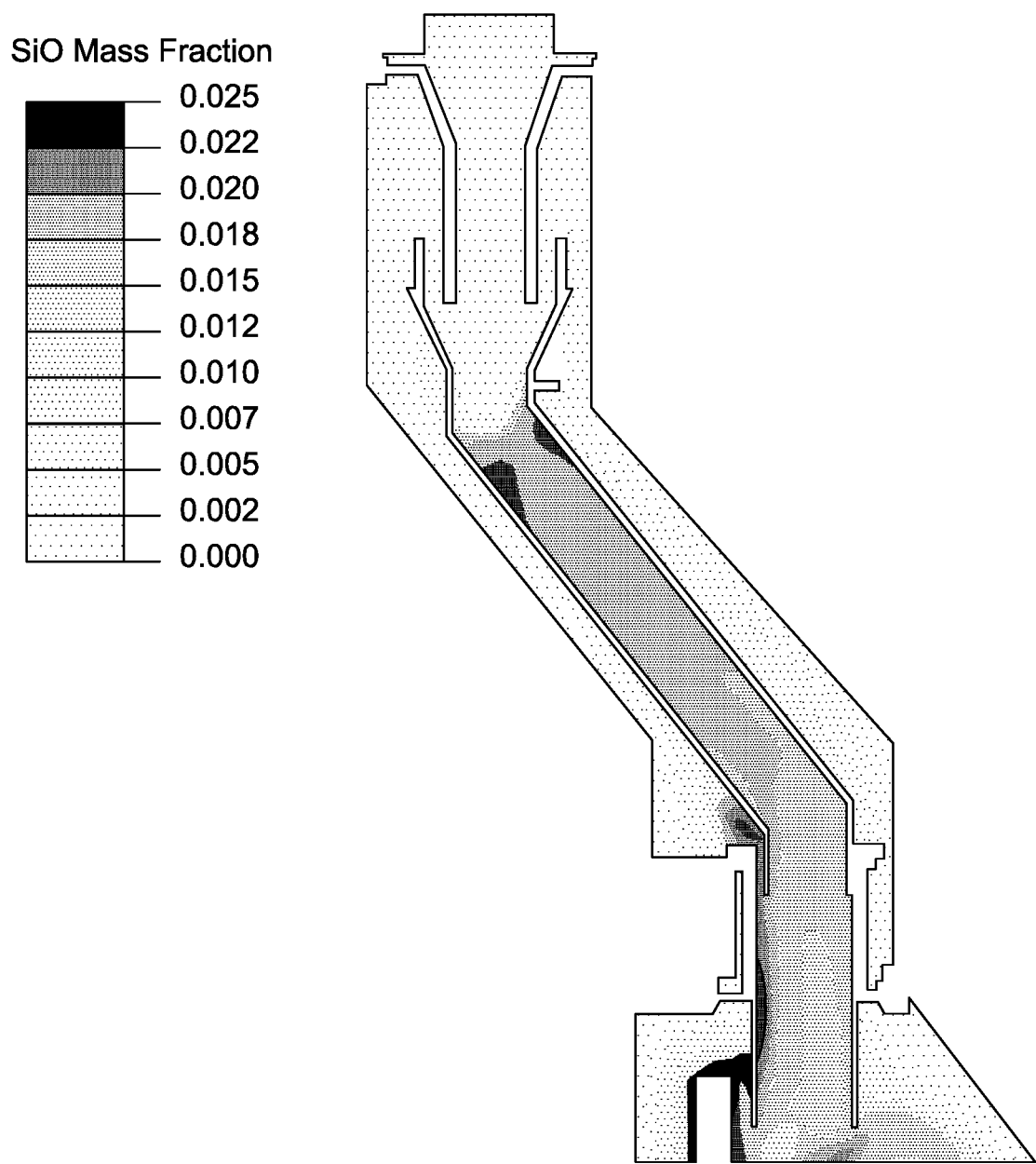
FIG. 10 is a simulation of the mass fraction of SiO in the silicon feed tube during the stabilization phase.

Example 1: SiO Mass Fraction in the Silicon Feed Tube During the Stabilization Phase and the Ingot Growth Phase FIG. 9 is a simulation of the mass fraction of silicon oxide (SiO) during the ingot growth phase and FIG. 10 is a simulation of the mass fraction of SiO during the stabilization phase. During the ingot growth phase (FIG. 9), the flow of SiO into the silicon feed tube was 0.0132 g/s. During the stabilization phase (FIG. 10), the flow of SiO into the silicon feed tube was 0.0142 g/s. As can be seen from the Figures, the stabilization phase included a higher mass fraction of SiO compared to the ingot growth phase. As shown in FIG. 10, the concentration of SiO was higher at the junction between the angled segment of the tube and the terminal segment of the tube (i.e., at the lower bend in the tube) where clogging most often occurs. During stabilization, the temperature at this junction is between 900° C. and 1000° C. which is within the critical temperature range for the CVD reaction.

Example 2: Reduction in Wafer Defects by Reducing Inert Gas Flow Rate

Figure 11:
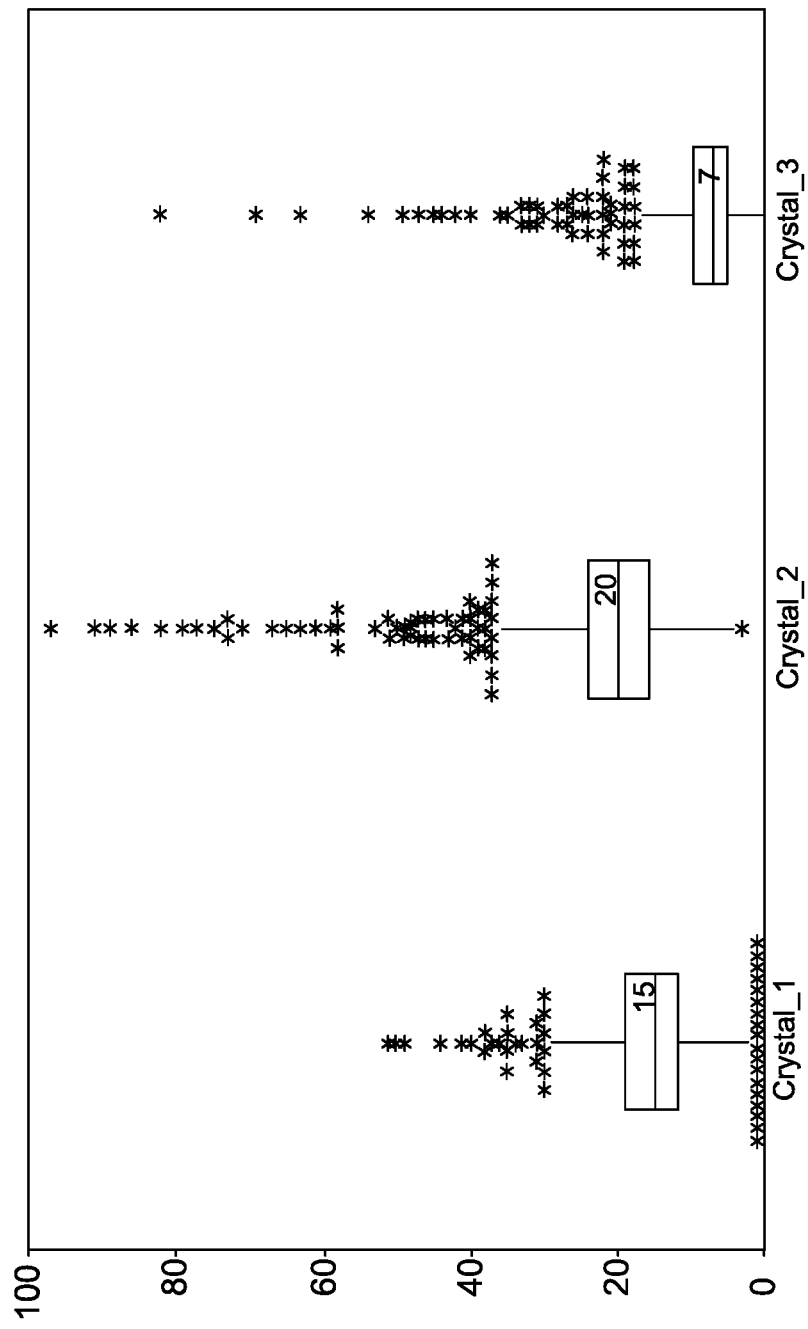
FIG. 11 shows box plots of the defect counts for wafers grown with an argon gas flow rate through the silicon feed tube of 12 slpm (Crystal 1 and Crystal 2) and for wafers grown with an argon gas flow rate through the silicon feed tube of 3 slpm (Crystal 3).

Three single crystal silicon ingots were prepared by continuous Czochralski with an in ingot puller apparatus shown in FIG. 1. Crystal 1 and Crystal 2 were grown using an argon flow rate of 12 slpm through the silicon feed tube 214 and Crystal 3 was grown using a flow rate of 3 slpm. The count of the defects on the surface of wafers sliced from the ingots was determined for each ingot and is shown in FIG. 11. As shown in FIG. 11, the ingot grown with an argon flow rate of 3 slpm through the silicon feed tube 214 had significantly less defects.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for growing a single crystal silicon ingot in a continuous Czochralski process in an ingot puller apparatus, the ingot puller apparatus comprising a housing defining a growth chamber, a crucible assembly disposed in the growth chamber, a silicon feed tube for adding solid silicon to the crucible assembly, the method comprising:
    forming a melt of silicon in a crucible assembly;
    applying heat to the melt in a stabilization phase;
    introducing an inert gas into the silicon feed tube at a first inert gas feed rate during the stabilization phase, inert gas being passing through the silicon feed tube and into the growth chamber during the stabilization phase;
    contacting a surface of the melt with a seed crystal;
    withdrawing a single crystal silicon ingot from the melt in an ingot growth phase; and
    introducing the inert gas into the silicon feed tube at a second inert gas feed rate during the ingot growth phase, the first inert gas feed rate being greater than the second inert gas feed rate, inert gas being passing through the silicon feed tube and into the growth chamber during the ingot growth phase.

2. The method as set forth in claim 1 wherein a ratio of the first inert gas feed rate to the second inert gas feed rate is at least 5:4.

3. The method as set forth in claim 1 wherein the first inert gas feed rate is greater than 3 slpm and the second inert gas feed rate is from 1 slpm to 3 slpm.

4. The method as set forth in claim 1 wherein the inert gas is argon.

5. The method as set forth in claim 1 wherein the silicon feed tube is disposed below a funnel, the inert gas flowing through the funnel into the silicon feed tube.

6. The method as set forth in claim 5 wherein the ingot puller apparatus comprises a silicon feed system comprising a feed tray, the silicon feed system being sealed, the inert gas being introduced into the silicon feed system from an inert gas feed vessel.

7. The method as set forth in claim 1 wherein the crucible assembly comprises a weir and a sidewall that define an outer melt zone between the weir and the sidewall, the method comprising introducing silicon to the silicon feed tube while withdrawing a single crystal silicon ingot from the melt, silicon passing through the silicon feed tube and entering the outer melt zone.

8. The method as set forth in claim 1 wherein the stabilization phase extends at least between formation of the melt and contacting the surface of the melt with the seed crystal.

9. The method as set forth in claim 8 wherein the stabilization phase comprises meltdown of silicon disposed in the crucible assembly.

10. A method for growing a single crystal silicon ingot in a continuous Czochralski process in an ingot puller apparatus, the ingot puller apparatus comprising a housing defining a growth chamber, a crucible assembly disposed in the growth chamber, a silicon feed tube for adding solid silicon to the crucible assembly, the method comprising:
    forming a melt of silicon in a crucible assembly;
    applying heat to the melt in a stabilization phase;
    introducing an inert gas into the silicon feed tube at a first inert gas feed rate during the stabilization phase, the first inert gas feed rate being between 2.5 and 3.5 slpm, inert gas being passing through the silicon feed tube and into the growth chamber during the stabilization phase;
    contacting a surface of the melt with a seed crystal;
    withdrawing a single crystal silicon ingot from the melt in an ingot growth phase; and
    introducing the inert gas into the silicon feed tube at a second inert gas feed rate during the ingot growth phase, the second inert gas feed rate being between 2.5 and 3.5 slpm, inert gas passing through the silicon feed tube and into the growth chamber during the ingot growth phase.

11. The method as set forth in claim 10 wherein the inert gas is argon.

12. The method as set forth in claim 10 wherein the first and second inert gas feed rates are each about 3.0 slpm.

13. The method as set forth in claim 1 wherein a ratio of the first inert gas feed rate to the second inert gas feed rate is at least 4:3.

14. The method as set forth in claim 1 wherein a ratio of the first inert gas feed rate to the second inert gas feed rate is at least 2:1.

* * * * *